(12) United States Patent
Rowley

(10) Patent No.: US 7,187,207 B2
(45) Date of Patent: Mar. 6, 2007

(54) LEAKAGE BALANCING TRANSISTOR FOR JITTER REDUCTION IN CML TO CMOS CONVERTERS

(75) Inventor: Matthew D. Rowley, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 135 days.

(21) Appl. No.: 11/168,034

(22) Filed: Jun. 27, 2005

(65) Prior Publication Data

US 2006/0290379 A1  Dec. 28, 2006

(51) Int. Cl.
*H03K 19/0175* (2006.01)
*H03K 19/094* (2006.01)
*H03K 19/20* (2006.01)
*H03K 19/086* (2006.01)

(52) U.S. Cl. ............................ 326/83; 326/62; 326/63; 326/64; 326/65; 326/66; 326/67; 326/68; 326/80; 326/81; 326/82; 326/84; 326/85; 326/86; 326/87; 326/112; 326/113; 326/114; 326/115; 326/126; 326/127; 327/52; 327/65

(58) Field of Classification Search ............ 326/62–68, 326/80–87, 112–115, 126, 127
See application file for complete search history.

(56) References Cited

U.S. PATENT DOCUMENTS

| 4,871,933 | A | * | 10/1989 | Galbraith | 327/53 |
| 5,399,920 | A | * | 3/1995 | Van Tran | 326/83 |
| 5,764,086 | A | * | 6/1998 | Nagamatsu et al. | 327/65 |
| 5,781,026 | A | * | 7/1998 | Chow | 326/26 |
| 6,084,459 | A | * | 7/2000 | Jeong | 327/333 |
| 6,201,418 | B1 | * | 3/2001 | Allmon | 327/52 |
| 6,232,794 | B1 | * | 5/2001 | Cox | 326/81 |
| 6,504,400 | B2 | * | 1/2003 | Tanaka et al. | 326/68 |
| 6,535,031 | B1 | * | 3/2003 | Nguyen et al. | 327/65 |
| 6,717,448 | B2 | * | 4/2004 | Heo et al. | 327/202 |
| 6,741,130 | B2 | * | 5/2004 | Wey et al. | 330/253 |
| 6,777,981 | B2 | * | 8/2004 | Kobayashi | 326/81 |
| 6,825,692 | B1 | * | 11/2004 | Chung et al. | 326/68 |
| 7,057,421 | B2 | * | 6/2006 | Shi et al. | 327/55 |
| 2002/0118047 | A1 | * | 8/2002 | Sim | 327/52 |
| 2003/0001622 | A1 | * | 1/2003 | Fletcher et al. | 326/95 |
| 2006/0082416 | A1 | * | 4/2006 | Marholev | 330/258 |
| 2006/0181938 | A1 | * | 8/2006 | Sohn | 365/189.11 |

* cited by examiner

*Primary Examiner*—Rexford Barnie
*Assistant Examiner*—Dylan White
(74) *Attorney, Agent, or Firm*—Alan K. Stewart; W. James Brady; Frederick J. Telecky, Jr.

(57) ABSTRACT

The CML (current mode logic) to CMOS converter with a leakage balancing transistor for jitter reduction includes: a differential input stage; an output stage having a first branch coupled to a first output of the differential input stage and a second branch coupled to a second output of the differential input stage; and a leakage balancing transistor coupled to the first branch of the output stage.

13 Claims, 1 Drawing Sheet

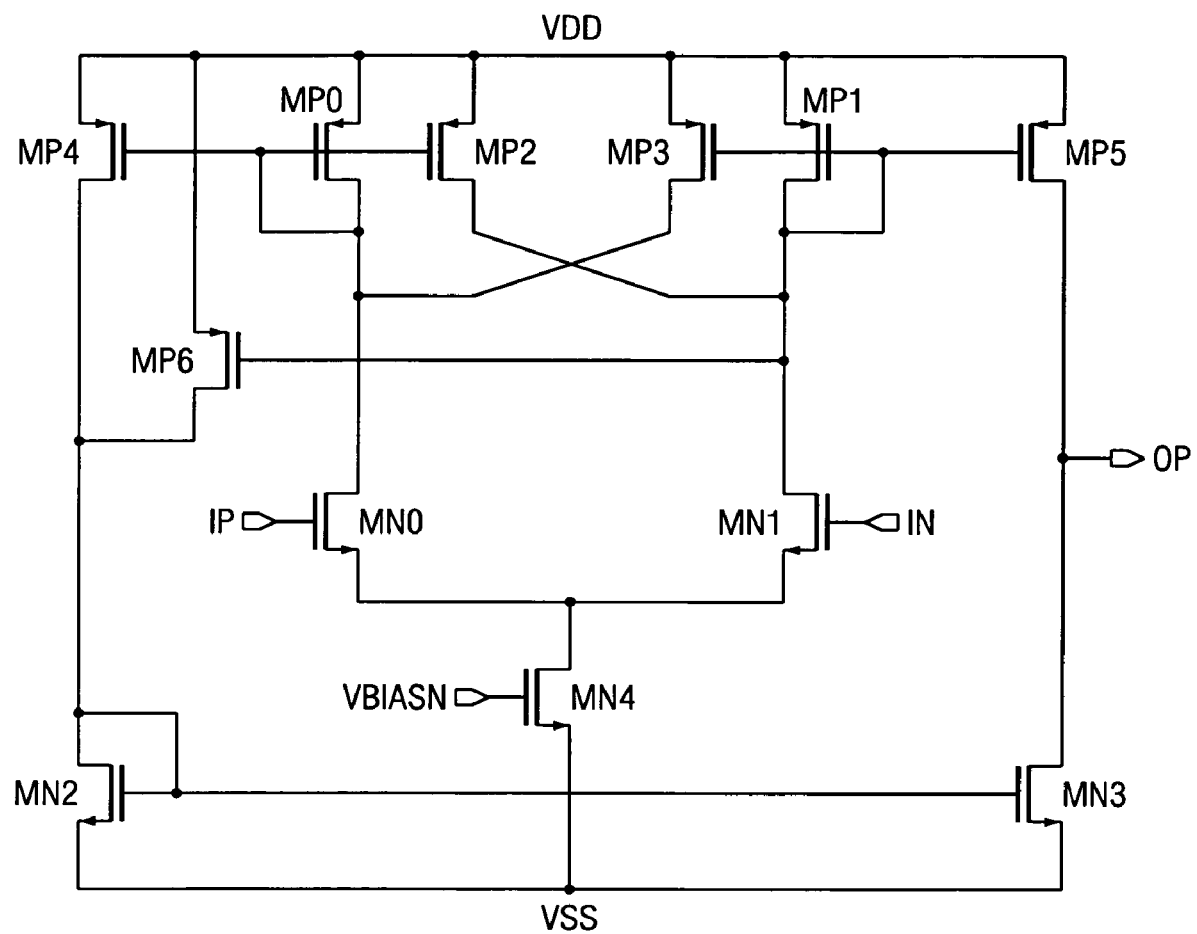

LEAKAGE BALANCING TRANSISTOR FOR JITTER REDUCTION IN CML TO CMOS CONVERTERS

FIELD OF THE INVENTION

The present invention relates to electronic circuitry and, in particular, to a CML (current mode logic) to CMOS converter with a leakage balancing transistor for jitter reduction.

BACKGROUND OF THE INVENTION

Prior art solutions have tried to realize balanced CML (current mode logic) to CMOS converters to improve jitter performance to different levels of success. The prior art solutions have figured out how to balance the PMOS path by using cross-coupled loads, however the prior art solutions have not tried to balance the NMOS path.

SUMMARY OF THE INVENTION

A CML (current mode logic) to CMOS converter with a leakage balancing transistor for jitter reduction includes: a differential input stage; an output stage having a first branch coupled to a first output of the differential input stage and a second branch coupled to a second output of the differential input stage; and a leakage balancing transistor coupled to the first branch of the output stage.

BRIEF DESCRIPTION OF THE DRAWINGS

In the drawings:

The Drawing is a circuit diagram of a preferred embodiment CML to CMOS converter with a leakage balancing transistor for jitter reduction, according to the present invention.

DETAILED DESCRIPTION OF PREFERRED EMBODIMENTS

The present invention maintains constant operating conditions within CML (current mode logic) to CMOS converters to improve jitter performance. By leaking a small amount of current into the inverting path of a wide range amplifier utilized as a CML to CMOS converter, the NMOS mirror pair is maintained in constant operating conditions. This balances the circuit performance and thus improves jitter performance.

A CML (current mode logic) to CMOS converter with a leakage balancing transistor for jitter reduction, according to the present invention, is shown in the Drawing. The circuit presented in the Drawing includes: a differential input stage which includes PMOS transistors MP0 and MP1, and NMOS transistors MN0, MN1, and MN4; cross-coupled loads formed by PMOS transistors MP2 and MP3; output stage formed by PMOS transistors MP4 and MP5, and NMOS transistors MN2 and MN3; leakage balancing transistor MP6; input nodes IP and IN; bias node VBIASN; source voltage nodes VDD and VSS; and output node OP. Transistor MP6 serves as the leakage balancing transistor in this circuit. During the phase when input IP is 'low', all the current is steered through transistor MN1 and thus no current flows through transistor MN2. The leakage transistor MP6 steers a small amount of current into transistor MN2 to keep the device out of subthreshold.

The present invention balances the NMOS path with only one additional transistor. This solution is low power because it is only being utilized during half the data cycle.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a differential input stage;
   an output stage having a first branch coupled to a first output of the differential input stage and a second branch coupled to a second output of the differential input stage; and
   a leakage balancing transistor coupled to the first branch of the output stage.

2. The circuit of claim 1 further comprising a cross-coupled load coupled to the differential input stage.

3. The circuit of claim 1 wherein the differential input stage comprises a first branch and a second branch, wherein the first branch provides a first output of differential input stage and the second branch provides a second output of the differential input stage.

4. The circuit of claim 3 wherein the differential input stage further comprises a bias current source coupled to the first and second branch.

5. The circuit of claim 2 wherein the cross-coupled load comprises two transistors.

6. The circuit of claim 5 wherein:
   a first of the two transistors is coupled to a first branch of the differential input stage and having a control node coupled to a second branch of the differential input stage; and
   a second of the two transistors is coupled to the second branch of the differential input stage and having a control node coupled to the first branch of the differential input stage.

7. The circuit of claim 3 wherein the first branch of the differential input stage has a control node coupled to a positive input node and the second branch of the differential input stage has a control node coupled to a negative input node.

8. The circuit of claim 1 wherein the differential input stage comprises a differential pair, a first current mirror device, and a second current mirror device.

9. The circuit of claim 8 wherein the first current mirror device mirrors a first current to the first branch of the output stage, and the second current mirror device mirrors a second current to the second branch of the output stage.

10. The circuit of claim 1 wherein the first branch of the output stage comprises:
    a first transistor having a control node coupled to a first output of the differential input stage; and
    a second transistor coupled to the first transistor.

11. The circuit of claim 10 wherein the second branch of the output stage comprises:
    a third transistor having a control node coupled to a second output of the differential input stage; and a fourth transistor coupled to the first transistor and having a control node coupled to a control node of the second transistor.

12. The circuit of claim 10 wherein the leakage balancing transistor is coupled to the second transistor and has a control node coupled to a second output of the differential input stage.

13. The circuit of claim 11 wherein the leakage balancing transistor is coupled to the second transistor and has a control node coupled to the second output of the differential input stage.

* * * * *